United States Patent
Chang et al.

(10) Patent No.: US 6,277,204 B1
(45) Date of Patent: Aug. 21, 2001

(54) METHODS FOR CLEANING WAFERS USED IN INTEGRATED CIRCUIT DEVICES

(75) Inventors: Kyu-hwan Chang, Seoul; Jae-inh Song, Kyungki-do; Heung-soo Park; Young-bum Koh, both of Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/593,344

(22) Filed: Jun. 14, 2000

Related U.S. Application Data

(62) Division of application No. 09/044,279, filed on Mar. 19, 1998, now Pat. No. 6,092,539.

(30) Foreign Application Priority Data

Mar. 20, 1997 (KR) .................................................. 97-9557

(51) Int. Cl.[7] .................................................. B08B 3/02
(52) U.S. Cl. .................................. 134/2; 134/3; 134/21; 134/22.19; 134/25.4; 134/26; 134/28; 134/29; 134/30; 134/34; 134/36; 134/41; 134/42; 134/902
(58) Field of Search .................. 134/2, 3, 21, 22.19, 134/25.4, 26, 28, 29, 30, 34, 36, 41, 42, 902

(56) References Cited

U.S. PATENT DOCUMENTS

| | | | |
|---|---|---|---|
| 4,582,624 | * 4/1986 | Enjo et al. ........................... | 252/79.4 |
| 4,749,440 | 6/1988 | Blackwood et al. .................. | 156/646 |
| 4,917,136 | 4/1990 | Ohmi et al. .......................... | 134/902 |
| 4,977,688 | 12/1990 | Rober, Jr. et al. .................... | 134/902 |
| 5,158,100 | * 10/1992 | Tanaka et al. ........................ | 134/105 |
| 5,169,408 | 12/1992 | Biggerstaff et al. ................. | 29/25.01 |
| 5,294,568 | * 3/1994 | McNeilly et al. .................... | 437/235 |
| 5,336,356 | 8/1994 | Ban et al. ........................... | 134/99.1 |
| 5,415,191 | 5/1995 | Mashimo et al. .................. | 134/102.1 |
| 5,487,398 | 1/1996 | Ohmi et al. .......................... | 134/95.1 |
| 5,511,569 | 4/1996 | Mukogawa ......................... | 134/104.1 |
| 5,520,744 | 5/1996 | Fujikawa et al. ...................... | 134/11 |
| 5,571,337 | 11/1996 | Mohindra et al. ................... | 134/25.4 |
| 5,571,375 | * 11/1996 | Izumi et al. ........................ | 156/646.1 |
| 5,658,417 | * 8/1997 | Watanabe et al. .................... | 156/345 |
| 5,783,495 | * 7/1998 | Li et al. ............................... | 438/738 |
| 5,820,689 | 10/1998 | Tseng et al. ............................. | 134/3 |
| 5,896,875 | 4/1999 | Yoneda .............................. | 134/102.3 |
| 5,976,312 | * 11/1999 | Shimizu et al. ..................... | 156/345 |
| 6,092,539 | * 7/2000 | Chang et al. ...................... | 134/57 R |
| 6,096,582 | * 8/2000 | Inoue et al. .......................... | 438/149 |

OTHER PUBLICATIONS

Syverson, Dan "An advanced dry/wet cleaning process for silicon surfaces"Proc.—Inst. Environ. Sci. 37th 829–33, 1991.*

Staffa et al "Anhydrous HF processing as an alternative to HF/$H_2$O processes". Mater. Res. Soc. Symp. Proc. 447, 1997.*

(Environmental, Safety, and Health in IC Production), 9–4.*

* cited by examiner

*Primary Examiner*—Sharidan Carrillo
(74) *Attorney, Agent, or Firm*—Myers Bigel Sibley & Sajovec, PA

(57) ABSTRACT

Apparatuses for cleaning wafers used in integrated circuit devices comprise: (1) a dry cleaning section comprising inert gas storage bath, a hydrogen fluoride gas storage bath, and a vapor storage bath containing a component selected from the group consisting of water vapor, alcohol vapor, and mixtures thereof and a gas mixer, wherein the inert gas storage bath, the hydrogen fluoride gas storage bath, and the vapor storage bath are in communication with the gas mixer; (2) a wet cleaning section comprising a first bath for storing a fluoride; a second bath for storing a liquid alcohol; and a cleaning solution storage bath in communication with the first bath and second bath, wherein the fluoride and the liquid alcohol form a cleaning solution which is stored in the cleaning solution storage bath; and (3) a common cleaning bath positioned between and in communication with the dry cleaning section and the wet cleaning section.

8 Claims, 3 Drawing Sheets

METHODS FOR CLEANING WAFERS USED IN INTEGRATED CIRCUIT DEVICES

The present application is a divisional application of Ser. No. 09/044,279 filed Mar. 19, 1998, now U.S. Pat. No. 6,092,539, the disclosure of which is incorporated herein by reference in its entirety.

FIELD OF THE INVENTION

The invention relates to apparatuses for cleaning wafers used in microelectronic devices.

BACKGROUND OF THE INVENTION

Cleaning processes typically play an important role in the formation integrated circuit (i.e., semiconductor) devices. Specifically, the cleaning processes are often necessary since wafers utilized in the devices usually become contaminated during processing.

The need for contaminant removal may be heightened since the devices tend to be more highly integrated, thus containing finer surface patterns. Conventional cleaning methods typically include dry and wet cleaning methods. In one example, a silicon wafer may be immersed in a cleaning bath containing a solution in order to remove various contaminants which may be present on the surface of the wafer. Examples of conventional solutions include RCA Standard Cleaning-1 ("SC-1") which is an aqueous mixture of ammonia, hydrogen peroxide, and deionized water; RCA Standard Cleaning-2 ("SC-2") which an aqueous mixture of hydrochloric acid, hydrogen peroxide, and deionized water; "SPM" which is an aqueous mixture of sulfuric acid and hydrogen peroxide; and "DHF" which is an aqueous mixture of hydrofluoric acid and deionized water. The SC-1 and SPM cleaning solutions have been often shown to remove various organic materials and contaminated particles present on a wafer surface. The SC-2 cleaning solution is capable of removing metal contaminants. Nonetheless, potential problems exist with respect to using the above solutions. More particularly, chemical oxide films may be formed due to the presence of aqueous hydrogen peroxide. In an attempt to remove the chemical oxide films, the DHF cleaning solution is typically employed.

The use of such a wet cleaning solution, however, may present problems. For instance, as the diameter of silicon wafers increase, the quantity of cleaning solution and deionized water needed to clean the wafer tends to also increase. As a result, heightened environmental risks may occur along with increased costs. Furthermore, a natural oxide film often results on the wafer surface, due to the wafer surface coming in contact with air while performing a cleaning process or prior to performing a subsequent process. Moreover, it is often difficult to incorporate a wet cleaning apparatus into an integrated circuit device fabrication system.

In an attempt to confront potential problems associated with wet cleaning solutions, dry cleaning methods have been proposed. One example of a dry cleaning method using anhydrous hydrogen fluoride and water vapor has been proposed. An improvement thereof is a gas-phase cleaning method using anhydrous hydrogen fluoride and alcohol vapor.

Dry cleaning methods may be more advantageous than wet cleaning methods in that they may present less potential environmental hazards. Moreover, a dry cleaning apparatus may be more easily incorporated into an integrated circuit device fabrication system. A silicon wafer surface exposed to a dry cleaning process also tends to be less susceptible to a natural oxide film formation since it is scarcely exposed to the air to be left as it is during the process. The dry cleaning process may also be effective at removing chemical oxide films that potentially form on the wafer surface. In spite of any perceived advantages, a dry cleaning method using anhydrous hydrogen fluoride and water vapor or alcohol vapor may be potentially ineffective at removing metal contaminants from a wafer surface.

Another example of a dry cleaning method has been proposed in U.S. Pat. No. 4,749,440. Specifically, the '440 patent proposes a method for removing an oxide film from a silicon wafer surface using anhydrous hydrogen fluoride gas. The proposed method, however, suffers from a potential shortcoming in that the wafer may eventually become disuniformly etched. Moreover, various contaminants (e.g., particles and metals) often are not sufficiently removed from the wafer surface.

In light of the above, research efforts have focused on improved methods for removing both metal and particle contaminants from the wafer surfaces. An example of one attempt involves a method which uses ultraviolet light in conjunction with chlorine gas. Specifically, chlorine gas is introduced on the substrate surface to potentially treat the metals and particles. Ultraviolet rays are thereafter irradiated onto the substrate surface. The method, however, is typically only effective at removing aluminum and zinc metals since these metals are able to react with chlorine under the low vapor pressure conditions which are employed.

In addition to the above, U.S. Pat. No. 5,169,408 proposes a cleaning apparatus for in-situ rinsing a semiconductor wafer using deionized rinse water.

There remains a need in the art to provide apparatuses and methods for cleaning wafers used in integrated circuit devices, which potentially are able to remove a wide variety of contaminants. There is also a need in the art to provide apparatuses and methods for cleaning wafers used in integrated circuit devices, which prevent the possibility of natural oxide film formation on the surfaces of the wafers.

SUMMARY OF THE INVENTION

It is therefore an object of the present invention to provide in-situ cleaning apparatuses and methods for wafers used in integrated circuit devices, which can successively perform a dry cleaning step and wet cleaning step.

It is another object of the present invention to provide in-situ cleaning apparatuses and methods for wafers used in integrated circuit devices, which are capable of removing a wide range of contaminants such as oxide film, polymers, particles and metals with preventing natural oxide film formation during cleaning.

These and other objects and advantages are provided by the invention. In one aspect, the invention relates to in-situ cleaning apparatuses for wafers for use in integrated circuit devices. The apparatuses comprise dry cleaning sections, wet cleaning sections, and common cleaning baths in communication with the dry cleaning sections and the wet cleaning sections. The dry cleaning sections comprise inert gas storage baths, anhydrous hydrogen fluoride storage baths, vapor storage baths containing components selected from the groups consisting of water vapor, alcohol vapor and mixtures thereof and a gas mixer for mixing the components supplied from the respective storage baths. The inert gas storage baths, the anhydrous hydrogen fluoride storage baths, and vapor storage baths are in communication with the gas mixer. The wet cleaning sections comprise: (1) first baths for storing fluorides; (2) second baths for storing liquid alcohols; and (3) cleaning solution storage baths in communication with the first baths and the second baths. The fluorides and the alcohols are typically mixed to form cleaning solutions, which are stored in the cleaning solution storage baths. Common cleaning baths are positioned between and in communication with the dry cleaning sections and the wet cleaning sections.

In a second aspect, the invention also provides methods for cleaning wafers used in integrated circuit device substrates. The methods comprise contacting wafers with a gaseous mixture comprising inert gas anhydrous hydrogen fluoride, and alcohol and/or water vapor; and contacting the wafers with cleaning solutions comprising fluorides, alcohols, and water.

DETAILED DESCRIPTION OF THE PREFERRED EMBODIMENTS

Figure 1:
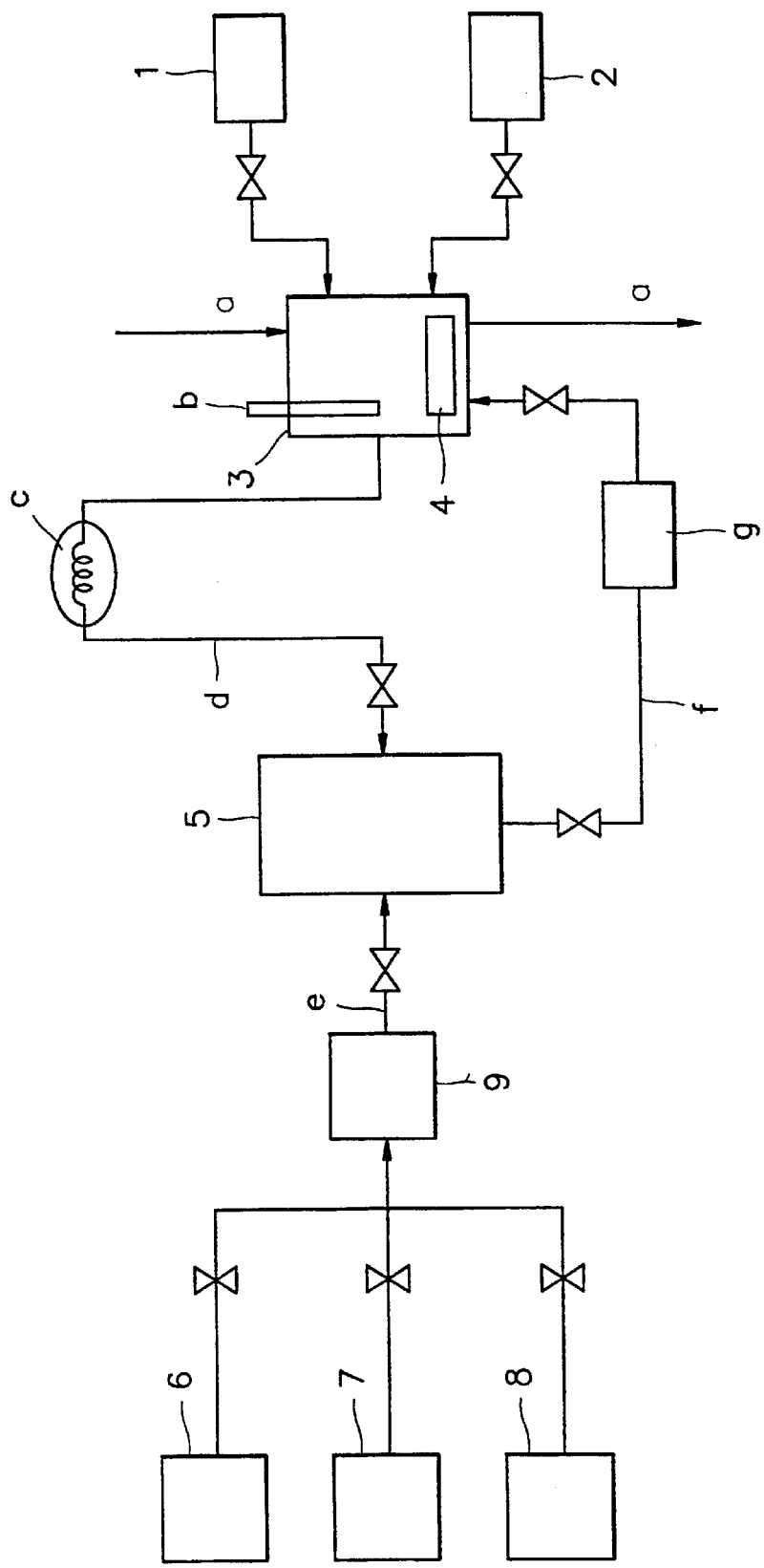
FIG. 1 is a schematic diagram illustrating an in-situ cleaning apparatus to the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In one aspect, the invention relates to in-situ cleaning apparatuses for wafers used in integrated circuit devices. The in-situ cleaning apparatuses comprise dry cleaning sections, wet cleaning sections, and common cleaning baths in communication with the dry cleaning sections and the wet cleaning sections. The dry cleaning sections comprise inert gas storage baths (the inert gas preferably being nitrogen), anhydrous hydrogen fluoride storage baths (preferably storing hydrogen fluoride gas), and vapor storage baths containing components selected from the groups consisting of water vapors, alcohol vapors and mixtures thereof, and a gas mixer for mixing the component supplied from respective storage baths. The inert gas storage baths, the anhydrous hydrogen fluoride storage baths, and vapor storage baths are in communication with the gas mixer.

The wet cleaning sections comprise: (1) first baths for storing fluorides; (2) second baths for storing liquid alcohols; and (3) cleaning solution storage baths in communication with the first baths and the second baths. The fluorides and the alcohols are typically mixed to form cleaning solutions which are stored in the cleaning solution storage baths. Common cleaning baths are positioned between and in communication with the dry cleaning sections and the wet cleaning sections, more specifically between and in communication with the gas mixer and the cleaning solution storage bath.

The units that form the apparatuses of the invention are formed from materials that are commonly known in the art. For example, the cleaning solution storage baths comprise materials selected from the group consisting of polytetrafluoroethylene, ceramic, and mixtures thereof.

Other devices and equipment may be employed in the apparatuses of the invention. For example, the cleaning solution storage bath may further include a cleaning solution concentration sensor for adjusting the flow of the solution from the first and second baths after checking whether the mixture ratio of the cleaning solution is in a predetermined range. Also, there may be provided deionized water supply and discharge lines for supplying and discharging deionized water in the cleaning solution storage bath.

A common cleaning bath is connected to a gas mixer for a dry cleaning process and to a cleaning solution storage bath for a wet cleaning process, respectively. Thus, dry and wet cleaning processes can be sequentially performed using a single cleaning bath. In other words, since the silicon wafer is not exposed to the air for a predetermined time interval before performing the wet cleaning process after completing the dry cleaning process, additional contamination such as the generation of a natural oxide film is prevented.

Also, between the common cleaning bath and the cleaning solution storage bath, there is provided a cleaning solution recovery line for recovering the cleaning solution containing contaminants from the common cleaning bath to the cleaning solution storage bath after the wet cleaning process. In the cleaning solution recovery line, there is provided a contaminant filter for filtering various contaminants contained in the contaminated cleaning solution. Thus, the cleaning solution contaminated by the metal contaminants or contaminated particles is recovered after the cleaning process and the filter filters the contaminants. Then, the cleaning solution is circulated in the cleaning solution storage bath to be recycled. In other words, since the cleaning solution is recycled several times, the processing cost can be saved and the environmental pollution due to the abuse of the cleaning solution can be prevented to the maximum.

In another aspect, the invention also provides methods for cleaning wafers used in integrated circuit device substrates. The methods comprise contacting wafers with a gaseous mixture comprising an inert gas, anhydrous hydrogen fluoride and alcohol and/or water vapor; and contacting the wafers with cleaning solutions comprising fluorides, alcohols, and water (preferably deionized water).

In the above, the alcohol vapor may be selected from, but not limited to, methanol, ethanol, isopropyl alcohol, and mixtures thereof. The anhydrous hydrogen fluorides employed in the vapors are] is preferably hydrogen fluorides gas.

The contacting of the wafers with the cleaning solutions may be carried out under various conditions. Preferably, the contacting of the wafers with the cleaning solutions is carried out under temperatures ranging from about ambient temperature to about 100° C.

The components which are present in the cleaning solutions may employed in various amounts. For example, the cleaning solutions may comprise from about 0.01 to about 20 weight percent of fluorides, from about 60 to about 99.99 weight percent of alcohols, and from about 0 to about 20 weight percent of water. A number of components may be employed in the cleaning solutions. For example, the fluoride may be an anhydrous fluoride selected from the group consisting of hydrogen fluoride, boron fluoride, ammonium fluoride, and mixtures thereof. The liquid alcohol may be selected from the group consisting of methanol, ethanol, isopropyl alcohol, and mixtures thereof.

The invention will now be described in greater detail in reference to the drawings. Referring to FIG. 1, an in-situ cleaning apparatus for a wafer used in an integrated circuit (e.g., semiconductor) device is shown. The in-situ cleaning apparatus comprises inert gas storage bath 6, anhydrous hydrogen fluoride storage bath 7, vapor storage bath 8, and a gas mixer 9 which mixes the components introduced from the storage baths described above. Additionally, the apparatus comprises a wet cleaning portion connected to common cleaning bath 5 having first and second storage baths, 1 and 2 respectively. The wet cleaning portion is connected via cleaning solution supply line d and gas supply line e. Accordingly, silicon wafers are able to become dry- and wet-cleaned with preventing potential air exposure during the process of the invention.

Figure 2:
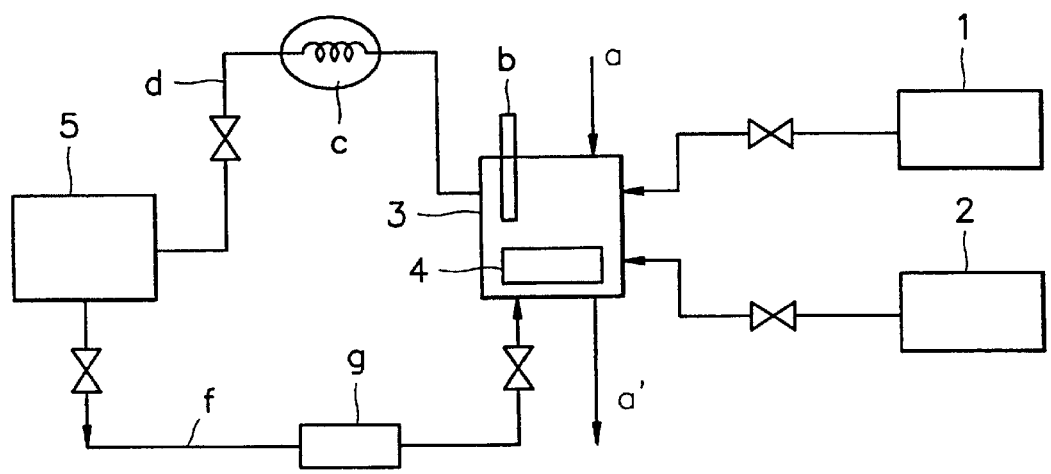
FIG. 2 is a schematic diagram illustrating a wet cleaning section of the apparatus depicted in FIG. 1.

Referring to FIG. 2, fluoride and liquid alcohol are contained in first 1 and second 2 storage baths respectively. The contents in these baths are mixed and supplied to the cleaning solution storage bath 3. A thermal control system, which includes thermostat 4, is present in cleaning solution storage bath 3 such that the cleaning solution may be heated to and controlled at a predetermined temperature, for example, between ambient temperature and about 100° C. A concentration sensor b is provided in cleaning solution storage bath 3 which measures the mixing ratio of the cleaning solution contained in bath 3 such that the flow rates from the first 1 and second 2 storage baths can be adjusted to maintain the current mixing ratio or attain a new predetermined mixing ratio. The cleaning solution storage bath 3 may further include a deionized water supply line for allowing water to enter and rinse the cleaning solution storage bath 3 and a discharge line a' for allowing the water to exit therefrom.

At the start of the wet cleaning process, the cleaning solution stored in cleaning solution storage bath 3 is transferred to common cleaning bath 5 via cleaning solution supply line d. Heat exchanger c is used in conjunction with the cleaning solution supply line d in an attempt to maintain the temperature of the cleaning solution within a predetermined range while the cleaning solution is supplied to common cleaning bath 5. Thereafter, the cleaning solution may be transported into the common cleaning bath 5 through a suitable piece of equipment such as, for example, a spray nozzle (not shown). As a result, the wafer may be cleaned.

Subsequent to the cleaning process, the contaminant-containing cleaning solution may be recovered from common cleaning bath 5 via recovery line f. Filter 9 may be utilized in conjunction with recovery line f in order to potentially remove contaminants from the contaminant-containing cleaning solution. The treated cleaning solution may then be recycled to the cleaning solution storage bath 5.

Referring again to FIG. 1, a cleaning method according to the invention is illustrated. Mixer 9 receives gases from inert gas storage bath 6, anhydrous hydrogen fluoride storage bath 7, and alcohol and/or water vapor storage bath 8. The mixed gases are transported to the common cleaning bath 5 through gas supply line e. The wafer may then be dry cleaned by the mixed gases. In this particular embodiment, the dry cleaning operation is performed under a nitrogen atmosphere.

Thereafter, cleaning solution storage bath 3 receives fluoride and liquid alcohol from first and second storage baths 1 and 2 respectively. The stored cleaning solution may then be transported into common cleaning bath 5 via cleaning solution supply line d and sprayed onto the wafer subsequent to the dry cleaning being carried out.

Figure 3:
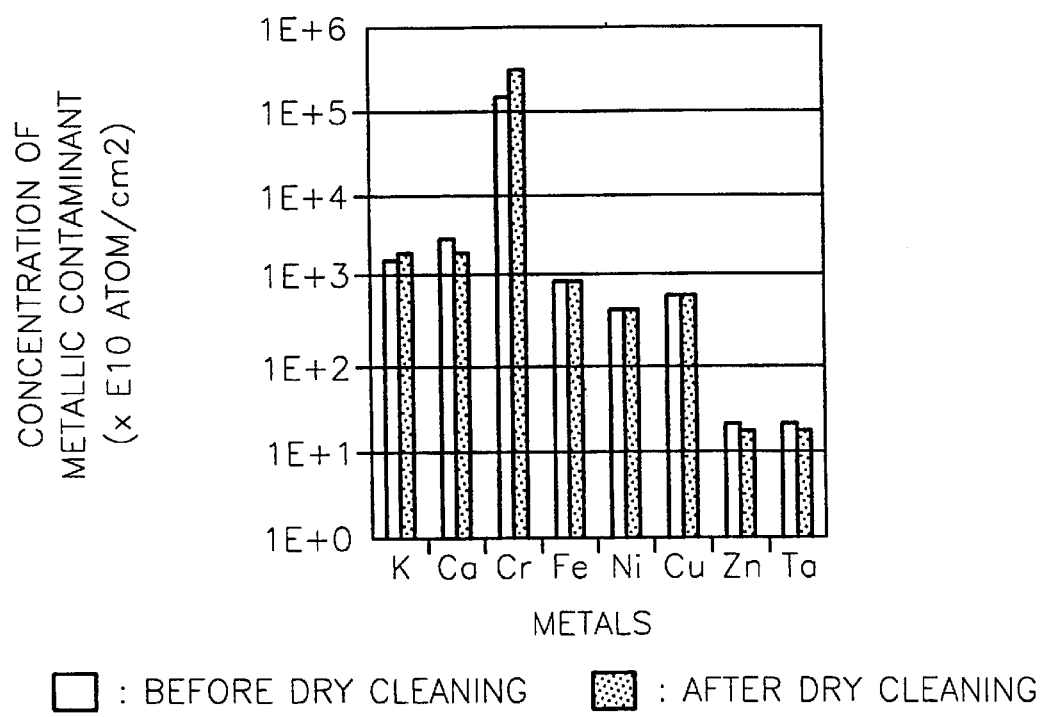
FIG. 3 is a graph which illustrates the effect of conventional dry cleaning processes on metal contaminant removal.

FIG. 3 is an illustration of a graph which compares the concentration of metal contaminants on a device before and after conventional dry cleaning processes. As shown, these processes may not appreciably remove metal contaminants from the device surface. With respect to chromium, the level of contamination may actually rise after a dry cleaning process.

Figure 4:
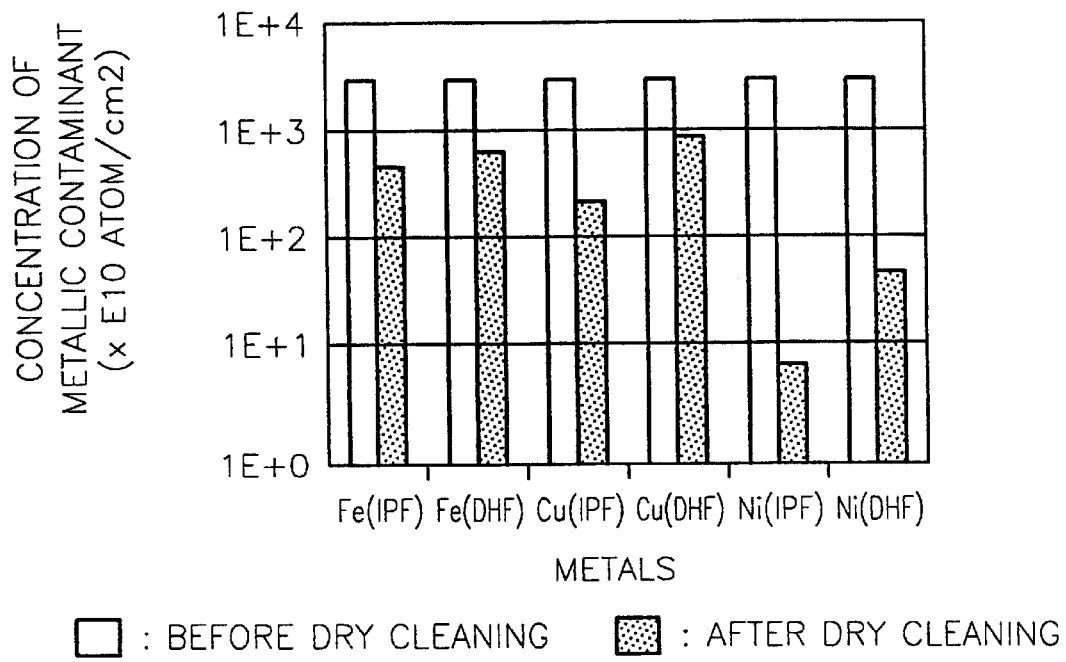
FIG. 4 is a graph for comparing the removal of metal contaminants before and after dry cleaning methods utilizing conventional DHF wet cleaning methods and a cleaning method according to the invention.

FIG. 4 compares the concentrations of metal contaminants on wafers before and after employing a cleaning process of the invention (IPF) and a conventional wet cleaning process (DHF). As depicted by FIG. 4, the content of the metal contaminants on the device may be reduced by virtue of the DHF cleaning system. The IPF process of the invention, however, generally results in a higher level of metal contaminant removal relative to the DHF process.

Figure 5:
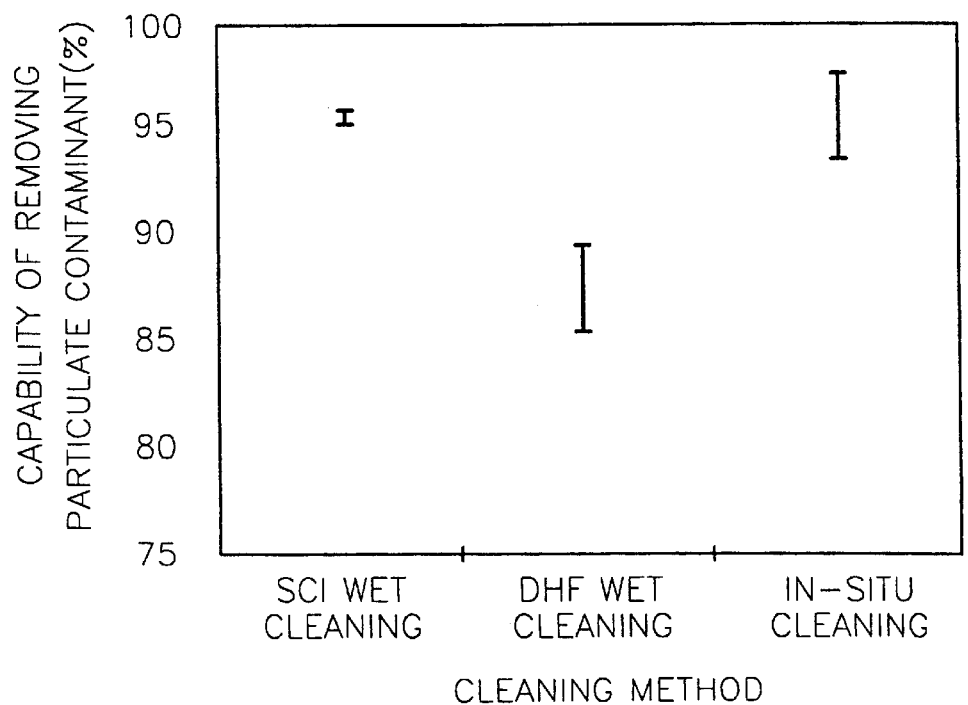
FIG. 5 is a graph which compares the removal of contaminated particles for a conventional DHF wet cleaning method, a conventional SC-1 wet cleaning method, and a cleaning method according to the invention.

FIG. 5 compares the effect of removing particulate contaminants by applying an SC-1 conventional wet cleaning solution, a conventional DHF cleaning method, and an in-situ method according to the invention. As depicted in this instance, the cleaning method of the invention is able to remove a higher level of particulate contamination relative to the other two conventional cleaning methods. As can be seen from FIGS. 4 and 5, the methods of the invention may be able to effectively remove particulate and metal contaminants from wafer surfaces.

The invention may be advantageous. For example, the processes allow for possible removal of a number of contaminants. Preferably, the first dry cleaning operations allow various organic contaminants to be removed along with oxidized materials which may be present. Remaining metal, particulate, and polymer contaminants may thereafter be removed by employing wet cleaning operations. Since the wafer is not exposed to the air, it is possible to prevent the formation of a natural oxide layer. In addition, the presence of the cleaning solution recovery line and filter allows contaminants to be removed from the used cleaning solution. As a result, a filtered cleaning solution may be recycled and used in another cleaning process. Thus, cost savings as well as potential environmental risk reduction can be realized.

In the drawings and specification, there have been disclosed typical preferred embodiments of the invention and, although specific terms are employed, they are used in a generic and descriptive sense only and not for the purposes of limitation, the scope of the invention being set forth in the following claims.

That which is claimed:

1. A method for in-situ cleaning a wafer used in an integrated circuit device, said method comprising the sequential steps of:
   (a) providing nitrogen gas contained in a nitrogen gas storage bath, anhydrous hydrogen fluoride gas contained in an anhydrous hydrogen fluoride storage bath, and a component selected from the group consisting of water vapors, alcohol vapors, and mixtures thereof contained in a vapor storage bath, and wherein a gas mixer is in communication with the nitrogen gas storage bath, the anhydrous hydrogen fluoride storage bath, and the vapor storage bath, and wherein a common cleaning bath having a wafer present therein and the gas mixer are connected to each other by a gas supply line;

(b) contacting the nitrogen gas, the anhydrous hydrogen fluoride gas, and the component selected from the group consisting of water vapors, alcohol vapors, and mixtures thereof in the gas mixer to form a gaseous mixture; then (c) introducing the gaseous mixture into the common cleaning bath containing the wafer therein through the gas supply line, and wherein the gaseous mixture contacts the wafer; then (d) providing a fluoride selected from the group consisting of hydrogen fluoride, boron fluoride, ammonium fluoride, and mixtures thereof, contained in a first bath, a liquid alcohol contained in a second bath, and deionized water contained in a deionized water supply; then (e) mixing the fluoride contained in the first bath, the liquid alcohol contained in the second bath, and the deionized water contained in the deionized water supply in a cleaning solution storage bath in communication with the first bath, the second bath, and the deionized water supply to form a cleaning solution, wherein the cleaning solution storage bath is connected to the common cleaning bath through a cleaning solution supply line; and then (f) introducing the cleaning solution into the common cleaning bath through the cleaning solution supply line to clean the wafer.

2. A method according to claim 1, wherein a thermal control system is provided in the cleaning solution storage bath and the temperature of the cleaning solution is maintained at a temperature of about 100° C.

3. A method according to claim 1, wherein the liquid alcohol is selected from the group consisting of methanol, ethanol, isopropyl alcohol, and mixtures thereof.

4. A method according to claim 1, wherein the cleaning solution comprises from about 0.01 to about 20 weight percent of fluoride, from about 60 to about 99.99 weight percent of liquid alcohol, and from about 0 to about 20 weight percent of deionized water.

5. A method according to claim 1, wherein the cleaning solution storage bath includes a cleaning solution concentration sensor for adjusting the flow from the first and second baths.

6. A method according to claim 1, wherein a heat exchanger is in communication with the cleaning solution supply line to maintain the temperature of the cleaning solution while the cleaning solution is supplied to the common cleaning bath.

7. A method according to claim 1, wherein a cleaning solution recovery line is in communication with the common cleaning bath and the cleaning solution storage bath, and wherein the cleaning solution recovery line allows for recycling treated cleaning solution from the common cleaning bath to the cleaning solution storage bath.

8. A method according to claim 7, wherein a filter is in communication with the cleaning solution recovery line to remove contaminants from the treated cleaning solution that is recycled.

* * * * *